(12) United States Patent
Sarihan

(10) Patent No.: US 8,080,444 B2
(45) Date of Patent: Dec. 20, 2011

(54) METHOD FOR FORMING A PACKAGED SEMICONDUCTOR DEVICE HAVING A GROUND PLANE

(75) Inventor: Vijay Sarihan, Paradise Valley, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 83 days.

(21) Appl. No.: 12/687,363

(22) Filed: Jan. 14, 2010

(65) Prior Publication Data

US 2011/0171782 A1 Jul. 14, 2011

(51) Int. Cl.
*H01L 21/66* (2006.01)
*H01L 21/00* (2006.01)
*H01L 21/50* (2006.01)
*H01L 21/48* (2006.01)
*H01L 21/44* (2006.01)

(52) U.S. Cl. ............ 438/106; 438/15; 438/64; 438/113; 438/124; 438/25; 257/E21.502; 257/E21.503; 257/E21.499

(58) Field of Classification Search ............ 257/E21.499, 257/E21.502, E21.503
See application file for complete search history.

(56) References Cited

U.S. PATENT DOCUMENTS

| 5,214,846 | A |  | 6/1993 | Asami et al. |
| 5,289,033 | A |  | 2/1994 | Asami et al. |
| 5,498,388 | A | * | 3/1996 | Kodai et al. .................... 264/263 |
| 6,309,908 | B1 | * | 10/2001 | Sarihan et al. ................ 438/106 |
| 6,351,883 | B1 |  | 3/2002 | Beaumont |
| 7,521,792 | B2 | * | 4/2009 | Ng ................................ 257/707 |

OTHER PUBLICATIONS

U.S. Appl. No. 12/419,708, filed Apr. 7, 2009.

* cited by examiner

*Primary Examiner* — Mohsen Ahmadi
(74) *Attorney, Agent, or Firm* — Joanna G. Chiu; Kim Marie Vo

(57) ABSTRACT

A method of placing a die includes providing an embedded plane. The embedded plane has a openings, grid lines, and protruding portions. Each of the plurality of openings are surrounding by a subset of the plurality of grid lines. At least one of the protruding portions extends into one of the openings. A die is placed into one of the openings and at least one of the protruding portions bends during such placement so that it is in contact with at least a portion of a minor surface of the die.

10 Claims, 3 Drawing Sheets

METHOD FOR FORMING A PACKAGED SEMICONDUCTOR DEVICE HAVING A GROUND PLANE

BACKGROUND

1. Field

This disclosure relates generally to semiconductor processing, and more specifically, to forming a packaged semiconductor device.

2. Related Art

In semiconductor processing, it is desirable to decrease package size, and one way to do so is through the use of chip scale packaging. One example of chip scale packaging is Redistributed Chip Packaging (RCP). In this technology, during the panelization process, a semiconductor die is placed in each of a plurality of openings of a grid plane which is located over a support substrate. However, during the encapsulation process, these semiconductor dies can drift, resulting in a variety of alignment problems, such as during the build up of subsequent layers.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As discussed above, during the encapsulation process, the semiconductor dies that are placed over the support substrate in each of a plurality of openings of the grid plane can drift, resulting in a variety of alignment problems. In one embodiment, a grid plane includes at least one protruding portion in each of its openings. The protruding portion may extend from a perimeter of the opening and operates to hold the semiconductor die in place during encapsulation.

Figure 1:
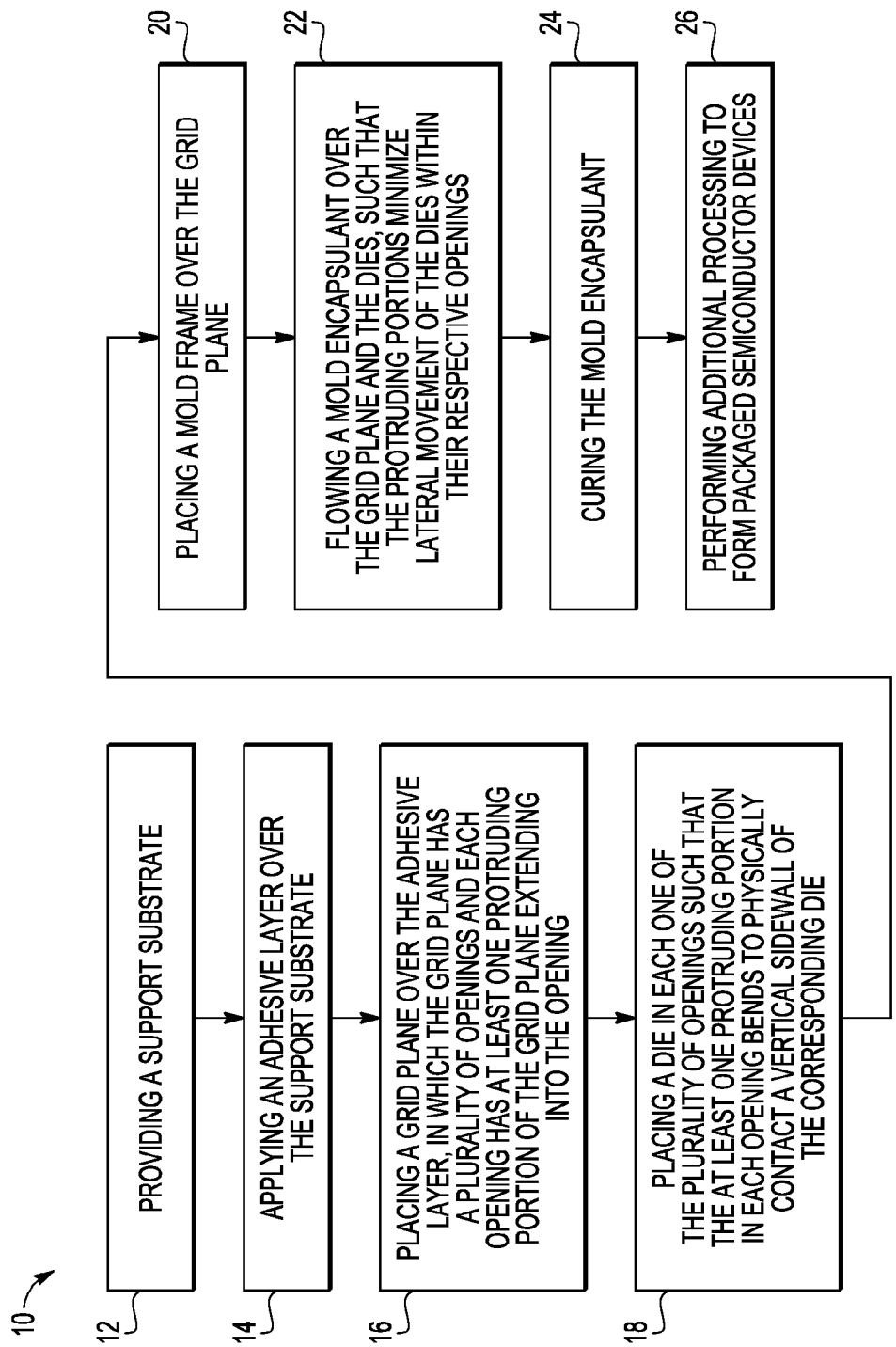
FIG. 1 illustrates, in flow diagram form, a method of forming a packaged semiconductor device in accordance with one embodiment of the present invention.
Figure 2:
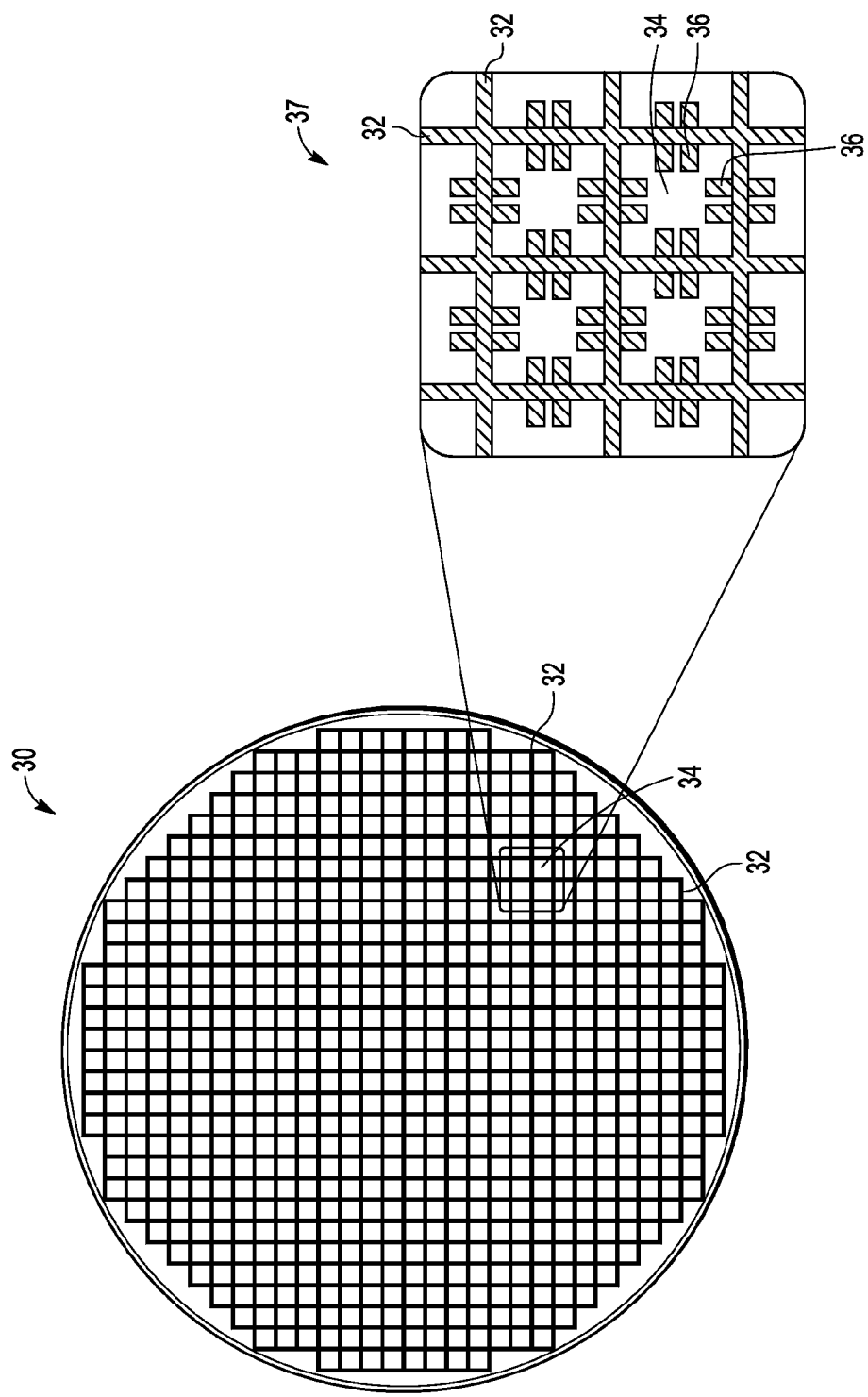
FIG. 2 illustrates a support structure and an overlying ground plane in accordance with one embodiment of the present invention.

FIG. 1 illustrates, in flow diagram form, a flow 10 for forming a packaged semiconductor device. Flow 10 begins with block 12 in which a support substrate is provided. Flow proceeds to block 14 in which an adhesive layer is applied over a major surface of the support substrate. In one embodiment, this adhesive layer is coated onto the support substrate. Flow then proceeds to block 16 in which a grid plane (also referred to as an embedded plane) is placed over the adhesive layer. The grid plane includes a plurality of openings, where each opening is capable of receiving a semiconductor die. In one embodiment, the openings of the grid plane are arranged in a rectangular grid formation. In one embodiment, the grid plane includes a plurality of grid lines which intersect at substantially ninety degree angles to form the openings. Also, each opening of the grid plane has at least one protruding portion of the grid plane extending into the opening. For example, FIG. 2 illustrates an example of a grid plane 30 (or an embedded plane 30) which includes a plurality of grid lines 32 which intersect to form a plurality of openings 34. Each of openings 34 includes at least one protruding portion 36 extending into the opening. In FIG. 2, a zoomed in view of a portion 37 of grid plane 30 is provided to illustrate protruding portions 36. In the zoomed view of portion 37, each opening 34 includes at least one protruding portion 36. In one embodiment, each opening 34 includes at least one protruding portion extending into the opening from each side of the opening. In the illustrated embodiment, each opening 34 has a perimeter and each side of the perimeter of the opening includes two protruding portion extending into the opening. Also, in the illustrated embodiment, each protruding portion 36 is a rectangular tab. In alternate embodiments, each opening may be different in shape, may include one or more protruding portions extending from less than all sides of the opening, or may include additional protruding portions. Operation of these protruding portions will be described in more detail in reference to flow 10 of FIG. 1 and FIG. 3 below.

In one embodiment, grid lines 32 and protruding portions 36 are each formed of a conductive material, such as, for example, copper. In one embodiment, protruding portions 36 are formed of the same material as grid lines 32, such as, for example, copper. Alternatively, protruding portions 36 may be formed of a different material than grid lines 32 (i.e. of a different material than the rest of grid plane 30).

Referring back to FIG. 1, flow proceeds from block 16 to block 18 in which a die is placed in each one of the plurality of openings 34 such that the at least one protruding portion in each opening bends to physically contact a vertical sidewall of the corresponding die. For example, referring to FIG. 3, a zoomed in view of a portion of an opening 34 is illustrated. The zoomed in portion illustrated in FIG. 3 includes two protruding portion 36 and a die 38 that has been placed in the opening. Note that die 38 can be described as having a first major surface and a second major surface, opposite the first major surface. Active circuitry of die 38 may be located in either the first major surface or the second major surface of die 38. Die 38 also includes a first vertical sidewall (or minor surface), a second vertical sidewall (or minor surface), a third vertical sidewall (or minor surface), and a fourth vertical sidewall (or minor surface). The vertical sidewalls (or minor surfaces) are located between the first and second major surfaces and are substantially perpendicular to the first and second major surfaces. Also, in one embodiment, each vertical sidewall or minor surface of die 38 is smaller in surface area as compared to either the first or second major surface.

Figure 3:
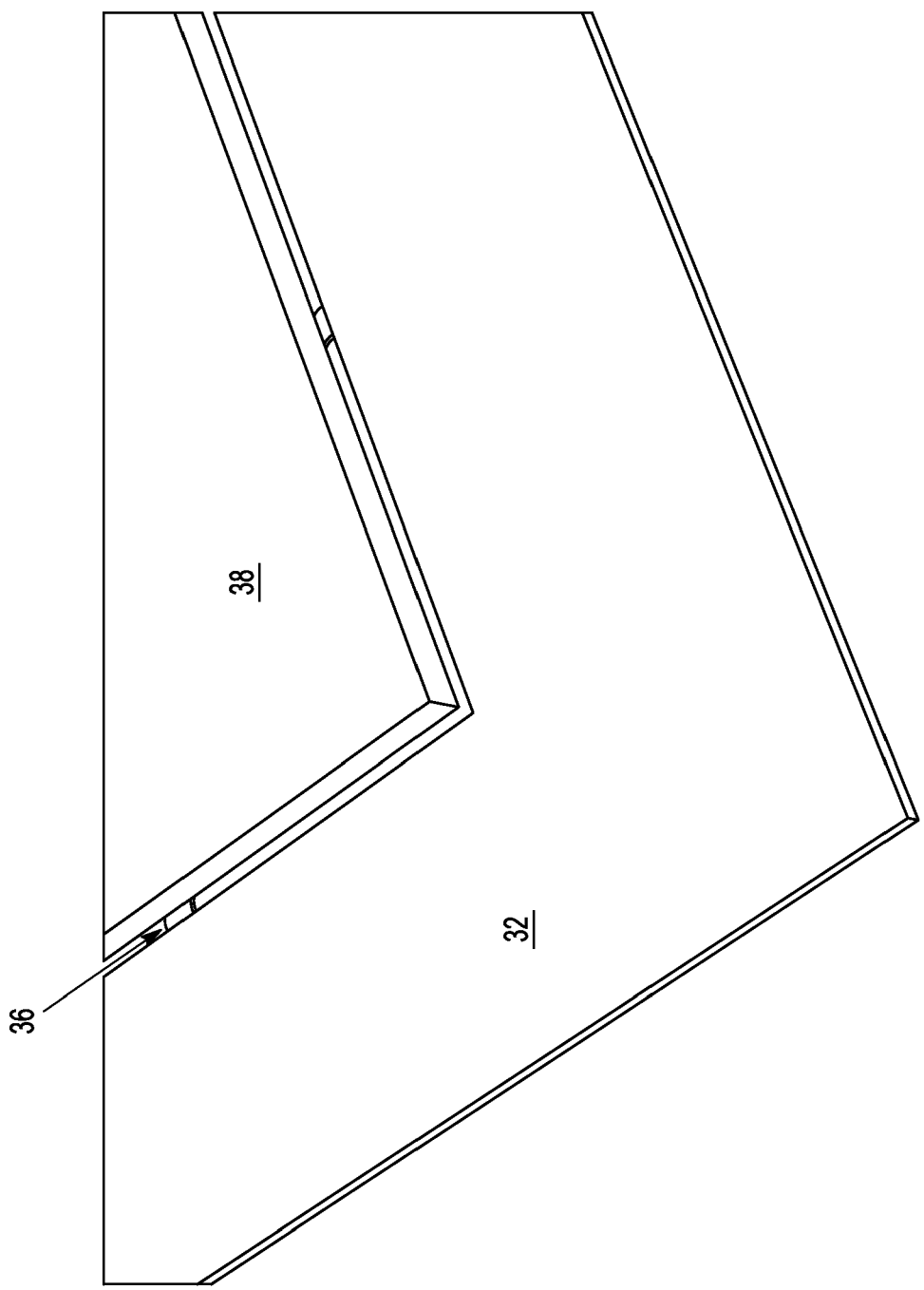
FIG. 3 illustrates a portion of the ground plane of FIG. 2 and a portion of a semiconductor die, in accordance with one embodiment of the present invention.

When die 38 is placed in the opening, the at least one protruding portion in the opening bends to physically contact at least one vertical sidewall of die 38. Therefore, as illustrated in FIG. 3, a protruding portion along one side of the opening is bent to contact one vertical sidewall of die 38 and another protruding portion along another side of the opening is bent to contact another sidewall of die 38. In one embodiment, each protruding portion of an opening bends to physically contact at least one vertical sidewall of the corresponding die when the corresponding die is placed in the opening. In one embodiment, the protruding portions within an opening bend while placing the die within the opening due to mechanical force.

Referring back to FIG. 1, flow proceeds from block 18 to block 20 in which a mold frame is placed over the grid plane. Flow then proceeds to block 22 in which a mold encapsulant is flowed over the grid plane and the dies, such that the protruding portions of the grid plane minimize lateral movement of the dies within their respective openings. For example, referring to FIG. 3, the bent protruding portions which contact the vertical sidewalls of die 38 prevent or minimize lateral movement of die 38 while flowing the mold encapsulant. In this manner, the dies placed in the openings of the grid plane can substantially remain in place during the molding process.

Referring back to FIG. 1, flow then proceeds from block 22 to block 24 in which the mold encapsulant is cured. Flow then proceeds to block 26 in which additional processing may be performed to form packaged semiconductor devices. For example, in one embodiment, at some point after curing the mold encapsulant, the plurality of encapsulated die are singulated to form individually packaged semiconductor die. In one embodiment, after singulating a die, the die is a redistributed chip package (RCP). Other processing may also be performed as needed to form packaged semiconductor die.

By now it should be appreciated that there has been provided a way to minimize lateral movement of die within a grid plane during the encapsulating process which may result in improved alignment and yield. In one embodiment, one or more protruding portions within each opening of a grid plane are used to minimize lateral movement of a die placed within the opening. In one embodiment, the one or more protruding portions within an opening are bent to contact at least a portion of a minor surface of the die within that opening. In one embodiment, this bending occurs as a result of placing the die within the opening.

The semiconductor substrate described herein can be any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, any number of protruding portions may be used within an opening. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of placing a die including providing an embedded plane, wherein the embedded plane has a plurality of openings, a plurality of grid lines, and a plurality of protruding portions, each of the plurality of openings is surrounding by a subset of the plurality of grid lines, and at least one of the plurality of protruding portions extends into one of the plurality of openings; placing a die in a first opening of the plurality of openings; and bending the at least one of the plurality of protruding portions in the first opening while placing the die in the first opening, wherein the at least one of the plurality of protruding portions is in contact with at least a portion of a minor surface of the die. Item 2 includes the method of item 1, and further includes flowing a mold encapsulant over the die and the embedded plane, wherein the at least one of the plurality of protruding portions in contact with the die minimizes a lateral movement of the die while flowing the mold encapsulant. Item 3 includes the method of item 2, and further includes curing the mold encapsulant. Item 4 includes the method of item 2, and further includes singulating the die. Item 5 includes the method of item 4, wherein after singulating the die the die is a redistributed chip package. Item 6 includes the method of item 1, wherein the minor surface of the die is a vertical sidewall of the die. Item 7 includes the method of item 1, wherein the plurality of protruding portions are a different material than the plurality of grid lines. Item 8 includes the method of item 1, wherein the plurality of grid lines comprise copper. Item 9 includes the method of item 5, wherein the plurality of protruding portions comprise copper. Item 10 includes the method of item 1, wherein each opening comprises at least two protruding portions along each side of the opening.

Item 11 includes a method of encapsulating a die including providing an embedded plane, wherein the embedded plane comprises an opening and a protruding portion extending into the opening; placing a die in the opening and in contact with the protruding portion; bending the protruding portion while placing the die, wherein after bending, the protruding portion is in contact with a vertical sidewall of the die; and flowing a mold encapsulant over the die and the embedded plane, wherein the protruding portion minimizes a lateral movement of the die while flowing the mold encapsulant. Item 12 includes the method of item 11, and further includes curing the mold encapsulant. Item 13 includes the method of item 12, and further includes singulating the die. Item 14 includes the method of item 13 wherein after singulating the die the die is a redistributed chip package. Item 15 includes the method of item 11, wherein the protruding portion of the embedded plane is a different material than the rest of the embedded plane. Item 16 includes the method of item 11, wherein both the embedded plane and the protruding portion comprise copper.

Item 17 includes a method of encapsulating a die including providing an embedded plane, wherein the embedded plane comprises an opening having a perimeter and protruding portions extending into the opening; placing a die in the opening and in contact with at least one of the protruding portions; bending the at least one of the protruding portions while placing the die, wherein after bending the at least one of protruding portions is in contact with a vertical sidewall of the die; and flowing a mold encapsulant over the die and the embedded plane, wherein the at least one protruding portion minimizes a lateral movement of the die while flowing the mold encapsulant. Item 18 includes the method of item 17, wherein each side of the perimeter of the opening comprises two protruding portions. Item 19 includes the method of item 17, wherein the bending occurs due to mechanical force. Item 20 includes the method of item 17, wherein the protruding portions are rectangular tabs.

What is claimed is:

1. A method of placing a die comprising:
   providing an embedded plane, wherein:
   the embedded plane has a plurality of openings, a plurality of grid lines, and a plurality of protruding portions;
   each of the plurality of openings is surrounding by a subset of the plurality of grid lines; and
   at least one of the plurality of protruding portions extends into one of the plurality of openings;
   placing a die in a first opening of the plurality of openings;
   bending the at least one of the plurality of protruding portions in the first opening while placing the die in the first opening, wherein the at least one of the plurality of protruding portions is in direct contact with at least a portion of a minor surface of the die, wherein the minor surface of the die is a vertical sidewall of the die;
   flowing a mold encapsulant over the die and the embedded plane, wherein the at least one of the plurality of protruding portions in contact with the die minimizes a lateral movement of the die while flowing the mold encapsulant;
   curing the mold encapsulant; and
   singulating the die, wherein after singulating the die the die is a redistributed chip package.

2. The method of claim 1, wherein the plurality of protruding portions are a different material than the plurality of grid lines.

3. The method of claim 1, wherein the plurality of grid lines comprise copper.

4. The method of claim 1, wherein the plurality of protruding portions comprise copper.

5. The method of claim 1, wherein each opening comprises at least two protruding portions along each side of the opening.

6. A method of encapsulating a die comprising:
   providing an embedded plane, wherein the embedded plane comprises a plurality of grid lines, a plurality of openings, and a plurality of protruding portions extending into each of the openings;
   placing a die in each opening of the plurality of openings and in contact with at least one protruding portion of the plurality of protruding portions;
   in each opening of the plurality of openings, bending the at least one protruding portion while placing the die, wherein after bending, the at least one protruding portion is in direct contact with a vertical sidewall of the die; and
   flowing a mold encapsulant over the die and the embedded plane, wherein the at least one protruding portion in contact with each die minimizes a lateral movement of the die while flowing the mold encapsulant;
   curing the mold encapsulant; and
   singulating the die, wherein after singulating the die, each die is a redistributed chip package.

7. The method of claim 6, wherein the protruding portion of the embedded plane is a different material than the rest of the embedded plane.

8. The method of claim 6, wherein both the embedded plane and the protruding portion comprise copper.

9. A method of encapsulating a die comprising:
   providing an embedded plane, wherein the embedded plane comprises an opening having a perimeter and a plurality of protruding portions extending into the opening, wherein each side of the perimeter of the opening comprises at least two protruding portions;
   placing a die in the opening and in contact with at least one of the plurality of protruding portions;
   bending the at least one of the plurality of protruding portions while placing the die, wherein after bending the at least one of the plurality of protruding portions is in direct contact with a vertical sidewall of the die, and wherein the bending occurs due to mechanical force; and
   flowing a mold encapsulant over the die and the embedded plane, wherein the at least one of the plurality of protruding portions in contact with the die minimizes a lateral movement of the die while flowing the mold encapsulant;
   curing the mold encapsulant; and singulating the die, wherein after singulating the die, each die is a redistributed chip package.

10. The method of claim 9, wherein the protruding portions are rectangular tabs.

* * * * *